US012451328B2

(12) United States Patent
Kim

(10) Patent No.: US 12,451,328 B2
(45) Date of Patent: Oct. 21, 2025

(54) PLASMA SOURCE USING PLANAR HELICAL COIL

(71) Applicant: Nam Hun Kim, Yeoju-si (KR)

(72) Inventor: Nam Hun Kim, Yeoju-si (KR)

(73) Assignee: Nam Hun Kim, Yeoju-si (KR)

( * ) Notice: Subject to any disclaimer, the term of this patent is extended or adjusted under 35 U.S.C. 154(b) by 16 days.

(21) Appl. No.: 18/291,657

(22) PCT Filed: Sep. 27, 2022

(86) PCT No.: PCT/KR2022/014426

§ 371 (c)(1),
(2) Date: Jan. 24, 2024

(87) PCT Pub. No.: WO2023/055022

PCT Pub. Date: Apr. 6, 2023

(65) Prior Publication Data

US 2025/0112027 A1 Apr. 3, 2025

(30) Foreign Application Priority Data

Sep. 30, 2021 (KR) ........................ 10-2021-0130292

(51) Int. Cl.
*H01J 37/32* (2006.01)

(52) U.S. Cl.
CPC ..... *H01J 37/3211* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 7,355,357 | B2 | 4/2008 | Park et al. | |
| 2006/0175016 | A1 | 8/2006 | Edamura et al. | |
| 2011/0094997 | A1 | 4/2011 | Yamazawa et al. | |
| 2013/0278141 | A1* | 10/2013 | Dorf ................. | H01J 37/32082 315/111.41 |
| 2019/0252153 | A1* | 8/2019 | Yeom ................ | H01J 37/32183 |
| 2021/0335583 | A1 | 10/2021 | Choi et al. | |

FOREIGN PATENT DOCUMENTS

| | | |
|---|---|---|
| JP | 2006-216903 A | 8/2006 |
| JP | 2007-095678 A | 4/2007 |
| JP | 2011-096687 A | 5/2011 |

(Continued)

OTHER PUBLICATIONS

Japanese Patent Office, Office Action issued in counterpart Japanese Patent Application No. 2024-537290, mailed on Dec. 10, 2024.

(Continued)

*Primary Examiner* — Crystal L Hammond

(74) *Attorney, Agent, or Firm* — Leydig, Voit & Mayer, Ltd.

(57) ABSTRACT

The present invention relates to a plasma source using a planar helical coil, comprising: a unit coil extending from a unit-extension terminal and extending in a circular shape to a unit-extension ending terminal in one plane, wherein a plurality of unit coils are staked and comprise a connection portion that connects the unit-extension ending terminal of one unit coil and the unit-extension terminal of another unit coil.

9 Claims, 8 Drawing Sheets

(56) References Cited

FOREIGN PATENT DOCUMENTS

| | | | | |
|---|---|---|---|---|
| JP | 2012-248578 A | | 12/2012 | |
| JP | 2013-214444 A | | 10/2013 | |
| KR | 10-1094919 B1 | | 12/2011 | |
| KR | 101812743 B1 | * | 1/2018 | ........ H01J 37/32174 |
| KR | 10-1914902 B1 | | 1/2019 | |
| KR | 10-2070544 B1 | | 1/2020 | |
| KR | 10-2148350 B1 | | 8/2020 | |

OTHER PUBLICATIONS

Japanese Patent Office, Second Office Action issued in corresponding Japanese Patent Application No. 2024-537290, mailed on Apr. 22, 2025.

KIPO, Office Action in corresponding Korean Patent Application No. 10-2021-0130292, issued on Mar. 13, 2024.

WIPO, International Search Report in counterpart International Patent Application No. PCT/KR2022/014426, mailed on Jan. 6, 2023.

WIPO, Written Opinion in counterpart International Patent Application No. PCT/KR2022/014426, mailed on Jan. 6, 2023.

* cited by examiner

PLASMA SOURCE USING PLANAR HELICAL COIL

TECHNICAL FIELD

The present disclosure relates to a plasma source using a planar helical coil, and more particularly, to a plasma source using a planar helical coil, for forming plasma within a chamber by stacking a plurality of unit coils formed in one plane and connecting the plurality of unit coils through a connector extending in a direction perpendicular to a plane defined by the unit coils.

BACKGROUND ART

In general, it is very important to ensure uniformity in a semiconductor manufacturing process, and the uniformity of a semiconductor may be ensured or adjusted in an etching process during the semiconductor manufacturing process.

A semiconductor etching process may be performed in a plasma chamber. In the plasma chamber, plasma is formed in an internal reaction space, and the semiconductor etching process is performed using the plasma.

A plasma source for forming plasma is provided above the plasma chamber, and a representative example of the plasma source is a capacitively coupled plasma (CCP) source and an inductively coupled plasma (ICP) source.

A CCP source uses an electric field, and with a CCP source, etching is performed at a slightly higher pressure than with an ICP source. A CCP source has a slow etching rate, but has excellent selectivity and process reproducibility.

However, a CCP source has the non-uniformity characteristics of plasma density, in which a plasma density at a central portion of a wafer is higher than a plasma density at an edge of the wafer. There is a problem in that high RF power needs to be applied to increase plasma density because the overall plasma density is low.

An ICP source uses an induced magnetic field and advantageously has a higher overall plasma density than a CCP source. An ICP source increases an etching rate at a lower pressure than a CCP source, but a plasma density at a central portion of a wafer is higher than a plasma density at an edge portion of the wafer, and the ICP source has a problem in terms of low selectivity and poor process reproducibility.

As described above, a conventional plasma source has a problem in that the plasma density at the central portion of the wafer is higher than the plasma density at the edge of the wafer.

When the plasma density at the central portion of the wafer is higher than the plasma density at the edge of the wafer, it is difficult to ensure uniformity at the edge of the wafer. Therefore, it is necessary to develop a plasma source for ensuring uniformity at the edge of a wafer.

DISCLOSURE

Technical Problem

The present disclosure is to overcome the above problem, and more particularly, relates to a plasma source using a planar helical coil, for forming plasma within a chamber by stacking a plurality of unit coils formed in one plane and connecting the plurality of unit coils through a connector extending in a direction perpendicular to a plane defined by the unit coils.

Technical Solution

A plasma source using a planar helical according to the present disclosure to overcome the above problem is provided above a chamber and forms plasma, and includes a unit coil extending from one unit-extension end and extending to another unit-extension end in a circular shape within one plane, the plurality of unit coils being stacked, and a connector configured to connect the other unit-extension end of one unit coil to the unit-extension end of another unit coil.

In the plasma source using a planar helical according to the present disclosure to overcome the above problem, the connector may extend perpendicular to a plane defined by the unit coil, and planes defined by the plurality of unit coils may extend in parallel to each other.

In the plasma source using a planar helical according to the present disclosure to overcome the above problem, the connector may have a length of about 5 mm to about 15 mm.

In the plasma source using a planar helical according to the present disclosure to overcome the above problem, a separation distance may be provided between the unit-extension end and the other unit-extension end of the unit coil.

In the plasma source using a planar helical according to the present disclosure to overcome the above problem, a diameter of the unit coil may be larger than a diameter or width of a wafer accommodated on a base plate inside the chamber, and planes defined by the plurality of unit coils may be in parallel to a plane on which the wafer is accommodated.

In the plasma source using a planar helical according to the present disclosure to overcome the above problem, the plurality of unit coils may be directed in a same direction toward the other unit-extension end from the unit-extension end.

In the plasma source using a planar helical according to the present disclosure to overcome the above problem, the plurality of unit coils may include a first unit coil extending counterclockwise to the other unit-extension end from the unit-extension end, and a second unit coil extending clockwise to the other unit-extension end from the unit-extension end.

In the plasma source using a planar helical according to the present disclosure to overcome the above problem, the first unit coil and the second unit coil may be alternately stacked.

In the plasma source using a planar helical according to the present disclosure to overcome the above problem, after the plurality of first unit coils are stacked, the second unit coil may be stacked, or after the plurality of second unit coils are stacked, the first unit coil may be stacked.

The plasma source using a planar helical according to the present disclosure to overcome the above problem may further include an internal coil having a smaller diameter than a diameter or width of a wafer accommodated on a base plate inside the chamber, wherein the internal coil may include a plurality of internal unit coils formed in a circular shape, and the plurality of internal unit coils may be provided on a same plane.

In the plasma source using a planar helical according to the present disclosure to overcome the above problem, the internal unit coil may extend in a circular shape from an internal unit-extension end to another internal unit-extension end and may further include an internal connector configured to connect the other internal unit-extension end of one internal unit coil to the internal unit-extension end of another internal unit coil.

In the plasma source using a planar helical according to the present disclosure to overcome the above problem, the plurality of internal connectors connecting the internal unit coils may extend in parallel to each other.

In the plasma source using a planar helical according to the present disclosure to overcome the above problem, an internal separation distance may be provided between the internal unit-extension end and the other internal unit-extension end of the internal unit coil.

In the plasma source using a planar helical according to the present disclosure to overcome the above problem, the plurality of internal unit coils may include a first internal unit coil extending counterclockwise to the other internal unit-extension end from the internal unit-extension end, and a second internal unit coil extending clockwise to the other internal unit-extension end from the internal unit-extension end.

Advantageous Effects

The present disclosure relates to a plasma source using a planar helical coil and advantageously increases a plasma density at an edge of a wafer as plasma is formed inside a chamber by stacking a plurality of unit coils having a larger diameter than a diameter or width of the wafer and connecting the plurality of unit coils through a connector extending in a direction perpendicular to a plane defined by the unit coil.

The present disclosure may advantageously finely adjust a plasma density at a central portion of a wafer as plasma is formed within a chamber by providing a plurality of internal unit coils having a smaller diameter than a diameter or width of the wafer on the same plane and connecting the plurality of internal unit through a connector.

MODE FOR INVENTION

Figure 1:
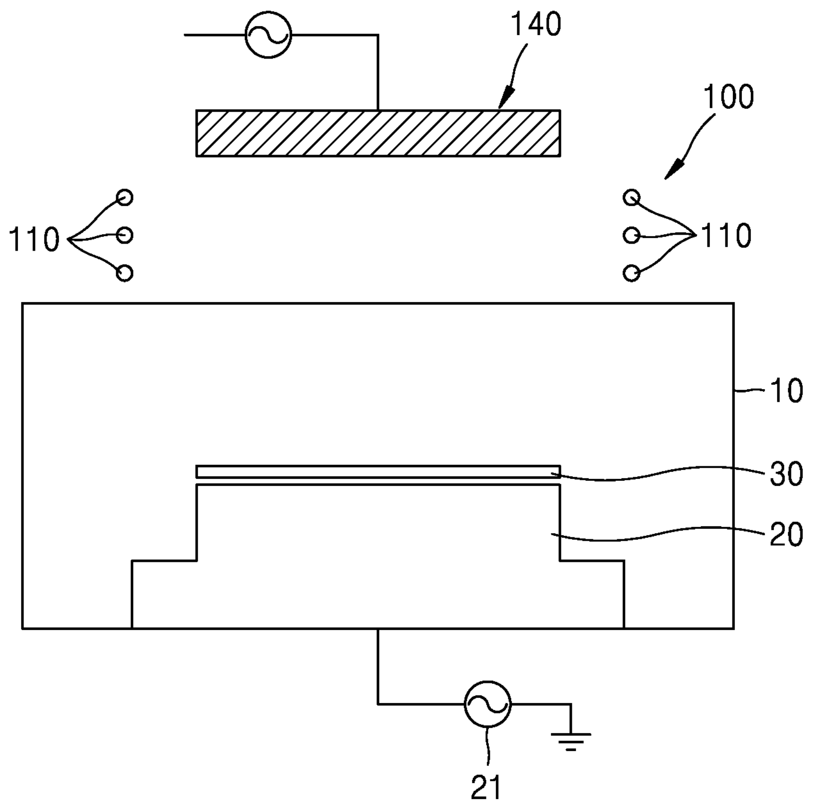
FIG. 1 is a diagram showing a plurality of unit coils having a larger diameter than a diameter or width of a wafer and being stacked, according to an embodiment of the present disclosure.

The present specification makes the scope of the present disclosure clear, and describes the principles of the present disclosure to allow a person skilled in the art to which the present disclosure pertains to practice the present disclosure. The described embodiments may be implemented in various forms.

Expressions such as “include” or “may include”, which may be used in various embodiments of the present disclosure, indicate the presence of a corresponding function, operation, or component, and may not limit additional one or more functions, operations, or components. It will be further understood that the terms “comprises” or “comprising,” when used in this specification, the presence of stated features, integers, stages, operations, elements, components, or combinations thereof but do not preclude the presence or addition of one or more other features, integers, stages, operations, elements, components, or combinations thereof.

When a component is referred to as being “connected, coupled” to another component, it will be understood that any component may be directly connected or coupled to the other component, but there may be a new other component between the component and the other component. On the other hand, when a component is referred to as being “directly connected to” or “directly coupled to” another component, it will be understood that there is no new other component between the component and the other component.

It will be understood that, although the terms first, second, and the like may be used herein to describe various components, the components should not be limited by the terms. The terms are used only for the purpose of distinguishing one component from another component.

The present disclosure relates to a plasma source using a planar helical coil and relates to a plasma source using a planar helical coil, for forming plasma within a chamber by stacking a plurality of unit coils formed in one plane and connecting the plurality of unit coils through a connector extending in a direction perpendicular to a plane defined by the unit coils.

The plasma source using the planar helical coil of the present disclosure may generate plasma having high symmetry and uniform plasma, and the plasma source using the planar helical coil of the present disclosure may be used for inductively coupled plasma (ICP) for improving reproducibility and selectivity while having a high etching rate.

The plasma source using the planar helical coil of the present disclosure may provide a coil having excellent azimuth symmetry, and the plasma source using the planar helical coil of the present disclosure may have a plasma density inside a chamber, which has a concave shape as a pressure increases in the chamber.

Through the plasma source using the planar helical coil of the present disclosure, the plasma density inside the chamber may be implemented in a concave shape by increasing the plasma density inside the chamber from the inside (center) of the chamber toward the outside (edge) of the chamber. Hereinafter, embodiments of the present disclosure will be described in detail with reference to the accompanying drawings.

Figure 2:
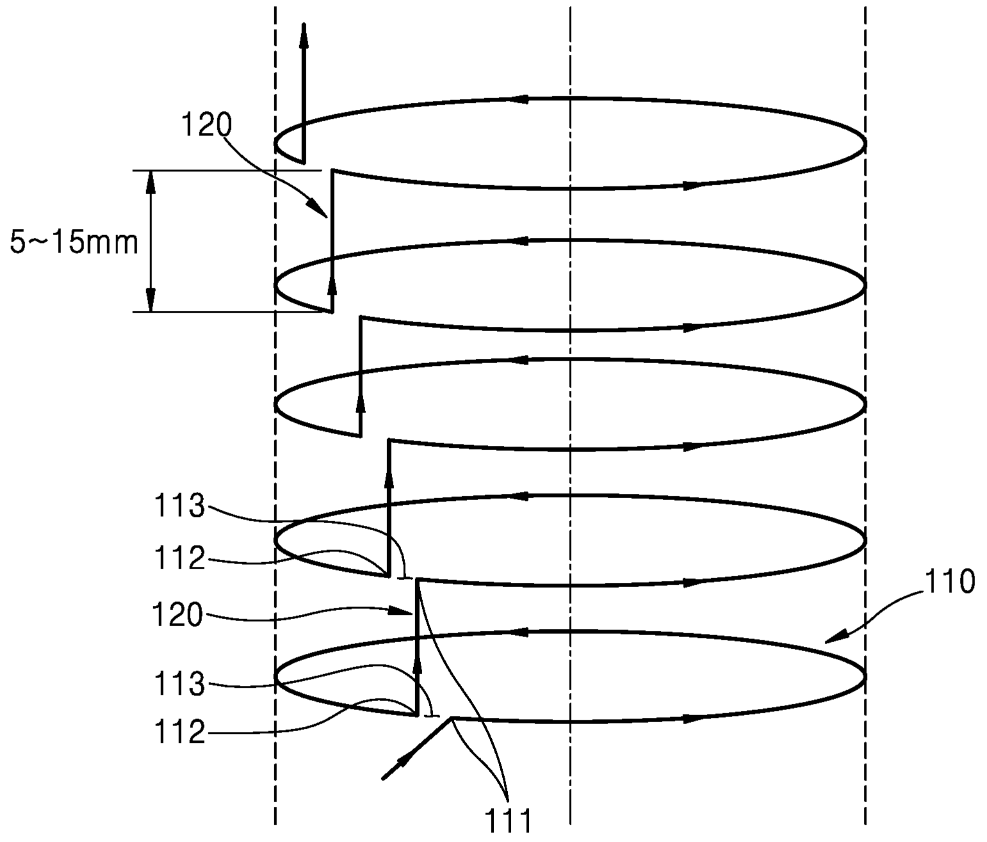
FIG. 2 is a diagram showing a plurality of unit coils are connected to each other through a connector extending in a direction perpendicular to a plane defined by a unit coil so that extension directions of the plurality of unit coils are the same, according to an embodiment of the present disclosure.

Referring to FIGS. 1 and 2, the plasma source using the planar helical coil according to an embodiment of the present disclosure may be provided above a chamber 10. The chamber 10 is provided with a base plate 20 on which a wafer 30 is to be accommodated, and an etching process is performed after the wafer 30 is accommodated on the base plate 20.

The base plate 20 may be coupled to a radio frequency (RF) generator 21 configured to apply a bias, and a bias may be applied to plasma through the RF generator 21 during etching.

The base plate 20 may be disposed in a central portion of the chamber 10, and as the base plate 20 is disposed in the central portion of the chamber 10, the wafer 30 may also be disposed in the central portion of the chamber 10.

The existing plasma source has non-uniform characteristics in which plasma density is high at a central portion of the chamber 10 and is low at an edge of the chamber 10. As a result, there is a problem in that it is difficult to ensure uniformity at the edge of the wafer 30.

The plasma source using the planar helical coil according to an embodiment of the present disclosure may provide a coil having excellent azimuthal symmetry to resolve the problem and may use a plasma source including a unit coil 110 and a connector 120. The unit coil 110 and the connector 120 may each be an external coil 100 disposed outside the wafer 30.

The unit coil 110 may include a coil through which current flows, extend from one unit-extension end 111, and extend to another unit-extension end 112 in a circular shape within one plane. The unit coil 110 may extend in a circular shape within one plane, and the plurality of unit coils 110 may be stacked.

The unit-extension end 111 of the unit coil 110 may be a starting point at which the unit coil 110 extends within one plane, and the other unit-extension end 112 may be an end point at which the unit coil 110 extends within one plane.

According to an embodiment of the present disclosure, a separation distance 113 may be provided between the unit-extension end 111 and the other unit-extension end 112 of the unit coil 110.

Referring to FIG. 2, the unit-extension end 111 and the other unit-extension end 112 are not in contact with each other and are formed with the separation distance 113. As the unit-extension end 111 and the other unit-extension end 112 are not in contact with each other and are formed with the separation distance 113, current may flow in one direction, and plasma arcing may be prevented.

According to an embodiment of the present disclosure, the separation distances 113 provided in the plurality of unit coils 110 may be the same. The plurality of unit coils 110 may have the same diameter, and in the plurality of unit coils 110, lengths extending from the unit-extension ends 111 to the other unit-extension ends 112 may be the same.

As such, in the plurality of unit coils 110, when the lengths extending from the unit-extension ends 111 to the other unit-extension ends 112 are the same and the separation distances 113 are the same, azimuthal symmetry may be achieved as azimuths formed in the plurality of unit coils 110 are the same.

Referring to FIG. 2, the connector 120 may connect one unit coil 110 and another unit coil 110 to each other and connect the other unit-extension end 112 of the unit coil 110 to the unit-extension end 111 of the other unit coil 110.

As described above, as the unit coils 110 are stacked, the other unit coil 110 may be provided directly above the unit coil 110. The connector 120 may connect the unit coil 110 and the other unit coil 110 provided directly above the unit coil 110 to each other.

According to an embodiment of the present disclosure, the connector 120 may extend perpendicularly to a plane defined by the unit coil 110, and planes defined by the plurality of unit coils 110 may extend in parallel to each other.

That is, referring to FIG. 2, the plurality of unit coils 110 that define the planes extending in parallel to each other may be stacked, and may be connected to each other through the connector 120 extending perpendicularly to a direction in which the unit coil 110 extends.

The plasma source using the planar helical coil according to an embodiment of the present disclosure may further include a RF power generator 140. RF power may be applied to the unit coil 110 through the RF power generator 140, and plasma may be formed in the chamber 10 by a change in an electromagnetic field excited by the unit coil 110.

According to an embodiment of the present disclosure, the length of the connection part 120 may be about 5 mm to about 15 mm. In detail, the connector 120 connecting the other unit-extension end 112 of the unit coil 110 to the unit-extension end 111 of the other unit coil 110 may have a length of about 5 mm to about 15 mm.

When the length of the connector 120 is excessively small (less than 5 mm), plasma arcing may occur between the unit coils 110 to cause interference therebetween. Therefore, the length of the connector 120 may be greater than 5 mm.

When the length of the connector 120 is excessively large (greater than 15 mm), there is a concern that plasma flickering or plasma-off may occur between the unit coils 110. In detail, when the length of the connector 120 is excessively large, there is a risk that plasma is not formed through the unit coil 110 in the case of plasma ignition. Therefore, the length of the connector 120 may be smaller than 15 mm.

According to an embodiment of the present disclosure, a diameter of the unit coil 110 may be larger than a diameter or width of the wafer 30 accommodated on the base plate 20 inside the chamber 10.

The unit coil 110 may be an external coil disposed outside the wafer 30, and when the wafer 30 is accommodated on the base plate 20, the unit coil 110 may be disposed outside the wafer 30. To this end, the diameter of the unit coil 110 may be larger than the diameter or width of the wafer 30.

As the plurality of unit coils 110 are stacked and placed outside the wafer 30, the plasma density at the edge of the wafer 30 may be increased, thereby preventing degradation in the uniformity of the plasma density at the edge of the wafer 30.

According to an embodiment of the present disclosure, the planes defined by the plurality of unit coils 110 may be in parallel to a plane on which the wafer 30 is accommodated. When the wafer 30 is accommodated on the base plate 20, a plane defined by the wafer 30 formed in a plate shape and a plane defined by the unit coil 110 may extend in parallel to each other. As such, an induced electric field parallel to a surface of the wafer 30 may be formed through the unit coil 110.

Referring to FIG. 2, the plurality of unit coils 110 may extend in the same direction toward the other unit-extension end 112 from the unit-extension end 111.

The plurality of unit coils 110 extend in the same direction toward the other unit-extension end 112 from the unit-extension end 111, and thus current flows in the same direction (clockwise or counterclockwise).

Figure 3:
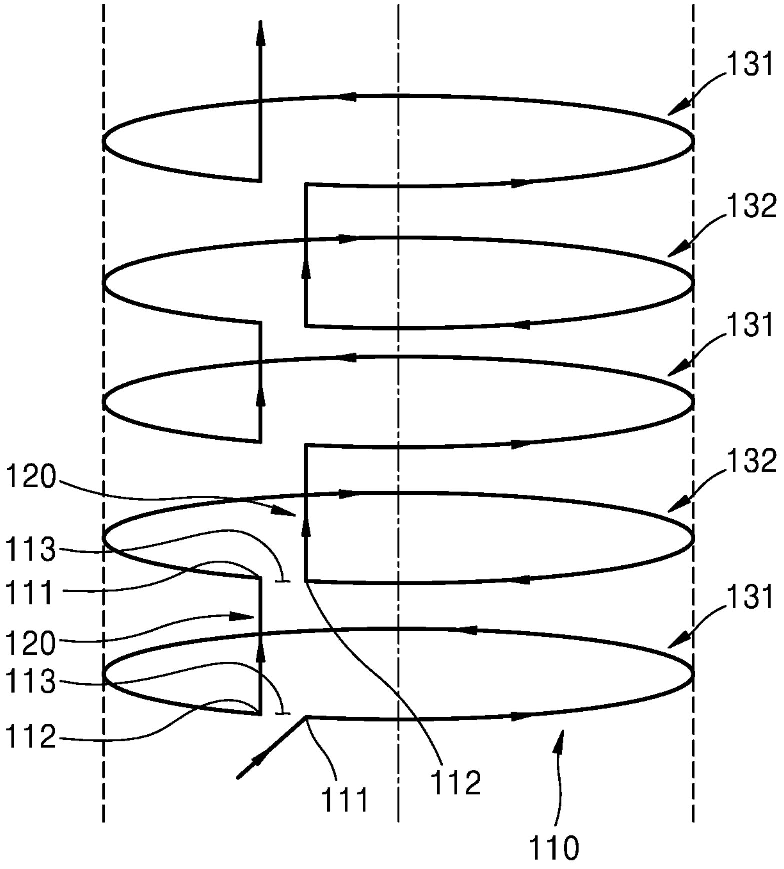
FIG. 3 is a diagram showing that a first unit coil and a second unit coil that extend in different directions are stacked alternately, according to an embodiment of the present disclosure.
Figure 4:
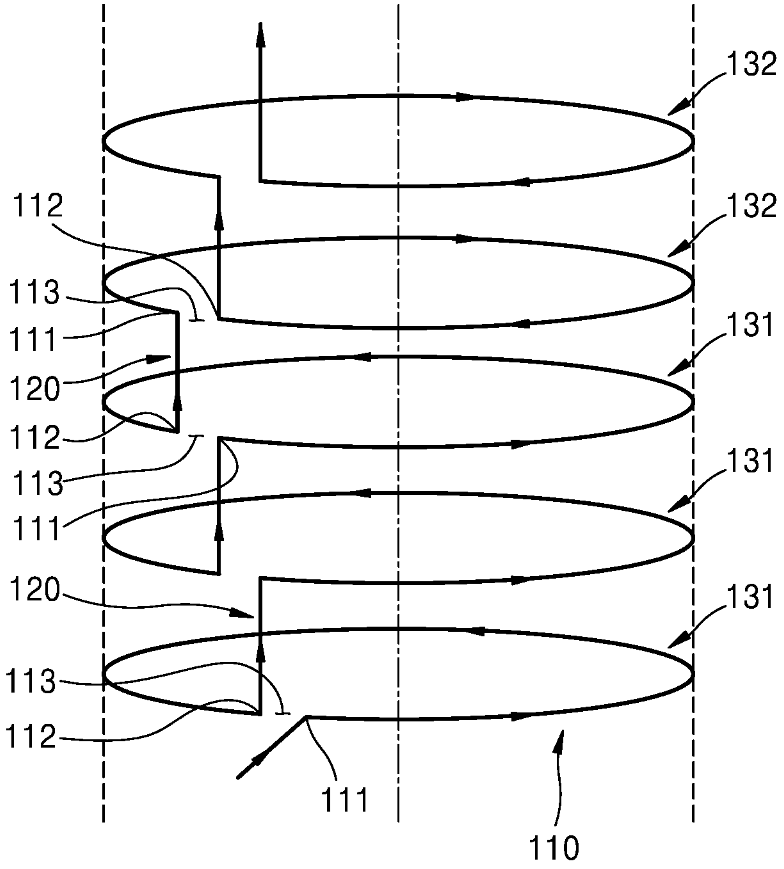
FIG. 4 is a diagram showing that a plurality of first unit coils are stacked and then a second unit coil having a different extension direction from the first unit coil is stacked, according to an embodiment of the present disclosure.

Referring to FIGS. 3 and 4, the plurality of unit coils 110 according to an embodiment of the present disclosure may include a first unit coil 131 extending counterclockwise to the other unit-extension end 112 from the unit-extension end 111 and a second unit coil 132 extending clockwise to the other unit-extension end 112 from the unit-extension end 111.

The first unit coil 131 and the second unit coil 132 may be wound in opposite directions, and as the first unit coil 131 and the second unit coil 132 extend in opposite directions, currents therein may flow in opposite directions. The winding directions of the first unit coil 131 and the second unit coil 132 may be the same as the directions in which currents flow therein, respectively.

In detail, the first unit coil 131 may be formed to make current flow counterclockwise, and the second unit coil 132 may be formed to make current flow clockwise.

Referring to FIG. 3, the first unit coil 131 and the second unit coil 132 may be stacked alternately. In detail, the first unit coil 131 and the second unit coil 132 may be stacked alternately one by one, and as such, current may flow in different directions from the adjacent unit coils 110.

Referring to FIG. 4, after the plurality of first unit coils 131 are stacked, the second unit coil 132 may be stacked or after the plurality of second unit coils 132 are stacked, the first unit coil 131 may be stacked.

In more detail, the first unit coil 131 and the second unit coil 132 may not be stacked alternately one by one, and the plurality of first unit coils 131 and the plurality of second unit coils 132 may be stacked in a random order.

According to an embodiment of the present disclosure, the number of plurality of unit coils 110 that are stacked may be adjusted, and as a plurality of unit coils having different winding directions (the first unit coil 131 and the second unit coil 132) are used, the plasma density may be finely adjusted.

In detail, a length $l$ of a coil in the plurality of unit coils 110 is changed, and thus a variable inductance L may be obtained, thereby changing impedance Z. Current may be changed by changing impedance, and accordingly, the plasma density may be changed while changing a current density $J_i$.

When the first unit coil 131 and the second unit coil 132 that extend in opposite directions are placed at the same time, the plasma density may be changed by changing an induced electric field parallel to the surface of the wafer 30 while changing an induced magnetic field.

In more detail, the induced electric field parallel to the surface of the wafer 30 may be changed depending on a direction in which the plurality of unit coils 110 having the same length are each wound, and thus the plasma density may be finely adjusted.

That is, the plasma density may be adjusted by changing impedance Z and current as the length $l$ of the coil is changed depending on the number of the plurality of unit coils 110 that are stacked, and in a coil having a constant length as the number of the stacked coils is determined, the plasma density may be changed by changing the induced electric field parallel to the surface of the wafer 30 while changing the induced magnetic field by adjusting the direction in which a unit coil is wound.

The plasma source using the planar helical coil according to an embodiment of the present disclosure may further include an internal coil 200. The internal coil 200 may include a coil through which current flows and may be provided to finely adjust the plasma density at the central portion of the wafer 30.

According to an embodiment of the present disclosure, the external coil 100 may be provided outside of the wafer 30, and the internal coil 200 may be provided inside the wafer 30.

As described above, the uniformity of the wafer 30 may be improved by increasing the plasma density at the edge of the wafer 30 through the external coil 100. In this case, when the internal coils 200 are used at the same time, the plasma density at the central portion of the wafer 30 may be finely adjusted while increasing the plasma density at the edge of the wafer 30.

Figure 5:
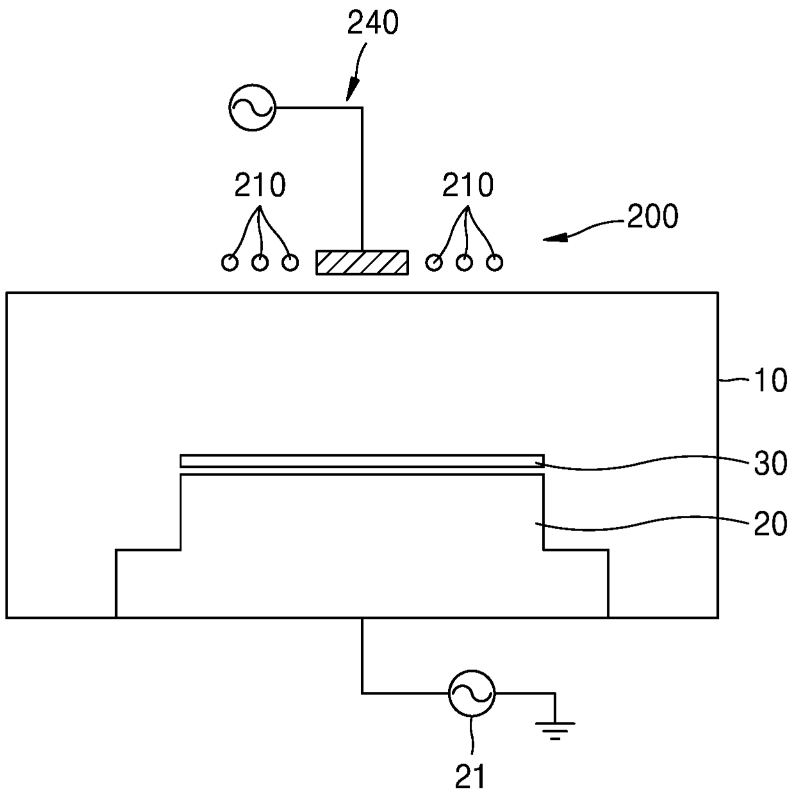
FIG. 5 is a diagram showing a plurality of internal unit coils having a smaller diameter than a diameter or width of a wafer, provided on the same plane, according to an embodiment of the present disclosure.

Referring to FIG. 5, the internal coil 200 may have a smaller diameter than a diameter or width of the wafer 30 accommodated on the base plate 20 inside the chamber 10 and include a plurality of internal unit coils 210 that are each formed in a circular shape.

Figure 6:
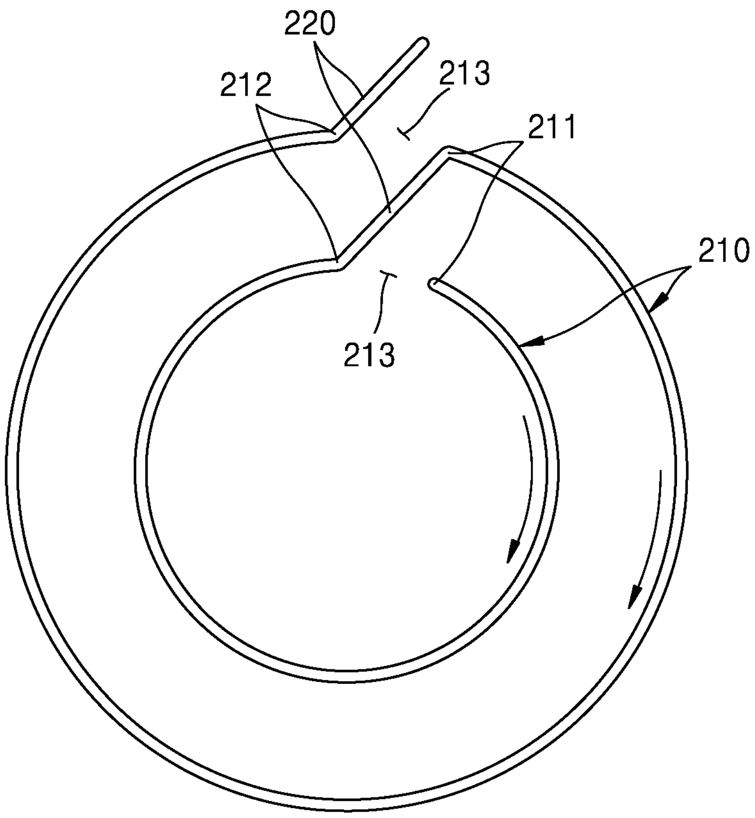
FIG. 6 is a diagram showing that a plurality of internal unit coils formed on the same plane are connected to each other through an internal connector, according to an embodiment of the present disclosure.

Referring to FIG. 6, the plurality of internal unit coils 210 may be provided on the same plane. In detail, the plurality of internal unit coils 210 may be formed on one layer.

The internal unit coil 210 may extend in a circular shape from one internal unit-extension end 211 to another internal unit-extension end 212. The internal unit-extension end 211 of the internal unit coil 210 may be a starting point at which the internal unit-extension end 211 extends, and the other internal unit-extension end 212 may be an end point at which the internal unit coil 210 extends.

According to an embodiment of the present disclosure, an internal separation distance 213 may be provided between the internal unit-extension end 211 and the other internal unit-extension end 212 of the internal unit coil 210.

Referring to FIG. 6, the internal unit-extension end 211 and the other internal unit-extension end 212 are not in contact with each other and are formed with the internal separation distance 213.

As the internal unit-extension end 211 and the other internal unit-extension end 212 are not in contact with each other and are formed with the internal separation distance 213, current may flow in one direction, and plasma arcing may be prevented.

Referring to FIG. 6, the internal coil 200 may further include an internal connector 220. The internal connector 220 may connect one internal unit coil 210 to another internal unit coil 210, and the internal connector 220 may connect the other internal unit-extension end 212 of the internal unit coil 210 to the internal unit-extension end 211 of the internal unit coil 210.

The internal coil 200 according to an embodiment of the present disclosure may include the plurality of internal unit coils 210 formed on the same plane, and the plurality of internal unit coils 210 may be connected to each other through the internal connector 220.

According to an embodiment of the present disclosure, the plurality of internal unit coils 210 may each have a diameter that gradually increases outward. In detail, the diameter of each of the plurality of internal unit coils 210 provided in one plane may increase outward from the center.

Here, the plurality of internal connectors 220 connecting the plurality of internal unit coils 210 may extend in parallel to each other. Referring to FIG. 6, the plurality of internal connections 220 may extend in parallel to each other on the same plane. As such, azimuths formed in the plurality of internal unit coils 210 may be equal to each other to obtain azimuthal symmetry.

The plasma source using the planar helical coil according to an embodiment of the present disclosure may further include an internal RF power generator 240. RF power may be applied to the internal unit coil 210 through the internal RF power generator 240, and plasma may be formed in the chamber 10 by a change in an electromagnetic field excited by internal unit coil 210.

The plasma source using the planar helical coil according to an embodiment of the present disclosure may increase a plasma density at the edge of the wafer 30 through the external coil 100 formed by stacking the plurality of external coils 100 formed on one plane.

The external coil 100 according to an embodiment of the present disclosure may be a helical coil having a diameter larger than a diameter or width of the wafer 30, and as the external coil 100 is used, a plasma density inside the chamber 10 in which the wafer 30 is accommodated may increase toward the outside of the chamber 10 from the inside of the chamber 10.

The plasma source using the planar helical coil according to an embodiment of the present disclosure may finely adjust a plasma density at the central portion (inside) of the chamber 10 through the internal coil 200 including the plurality of internal unit coils 210 on the same plane. The internal coil 200 may be a spiral coil having a smaller diameter than a diameter or width of the wafer 30.

When the plasma density increases toward the outside of the chamber 10 from the inside of the chamber 10 through the external coil 100, the plasma density at the central portion of the chamber 10 may be finely adjusted as the internal coil 200 is used.

In detail, when the plasma density increases toward the outside of the chamber 10 from the inside of the chamber 10 through the external coil 100, the internal coil 200 may be used to prevent degradation in the plasma density at the central portion of the chamber 10. As such, uniformity in the central portion and edge portion of the wafer 30 may be improved.

Figure 7:
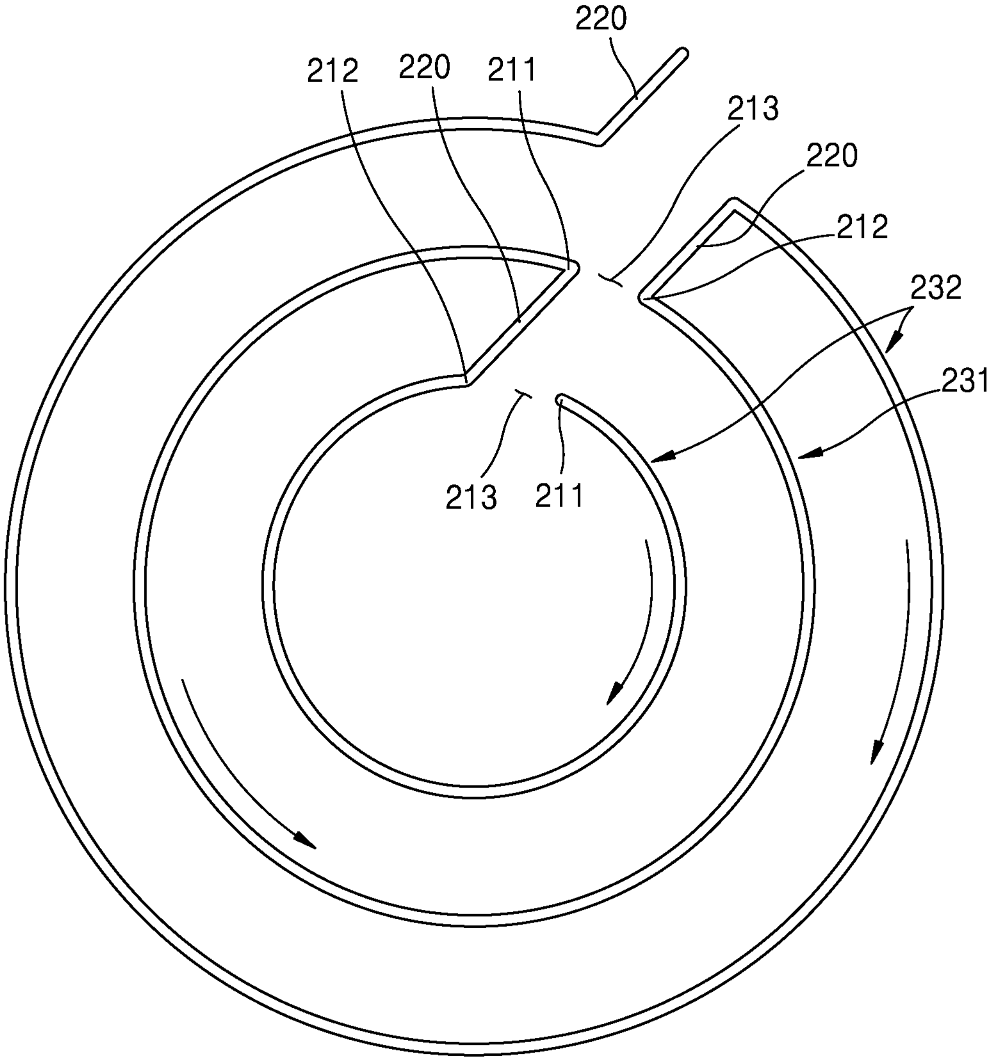
FIG. 7 is a diagram showing that a first internal unit coil and a second internal unit coil, which extend in different directions, extend alternately, according to an embodiment of the present disclosure.

Referring to FIGS. 6 and 7, the plurality of internal unit coils 210 according to an embodiment of the present disclosure may include a first internal unit coil 231 extending counterclockwise to the other internal unit-extension end 212 from the internal unit-extension end 211, and a second internal unit coil 232 extending clockwise to the other internal unit-extension end 212 from the internal unit-extension end 211.

The first internal unit coil 231 and the second internal unit coil 232 may be wound in opposite directions, and as the first internal unit coil 231 and the second internal unit coil 232 extend in opposite directions, currents therein may flow in opposite directions. The winding directions of the first internal unit coil 231 and the second internal unit coil 232 may be the same as the directions in which currents flow therein, respectively.

In detail, the first internal unit coil 231 may be formed to make current flow counterclockwise, and the second internal unit coil 232 may be formed to make current flow clockwise.

Referring to FIG. 7, the first internal unit coil 231 and the second internal unit coil 232 may be stacked alternately. In detail, the first internal unit coil 231 and the second internal unit coil 232 may extend alternately one by one, and as such, current may flow in different directions from the adjacent internal unit coils 210.

Figure 8:
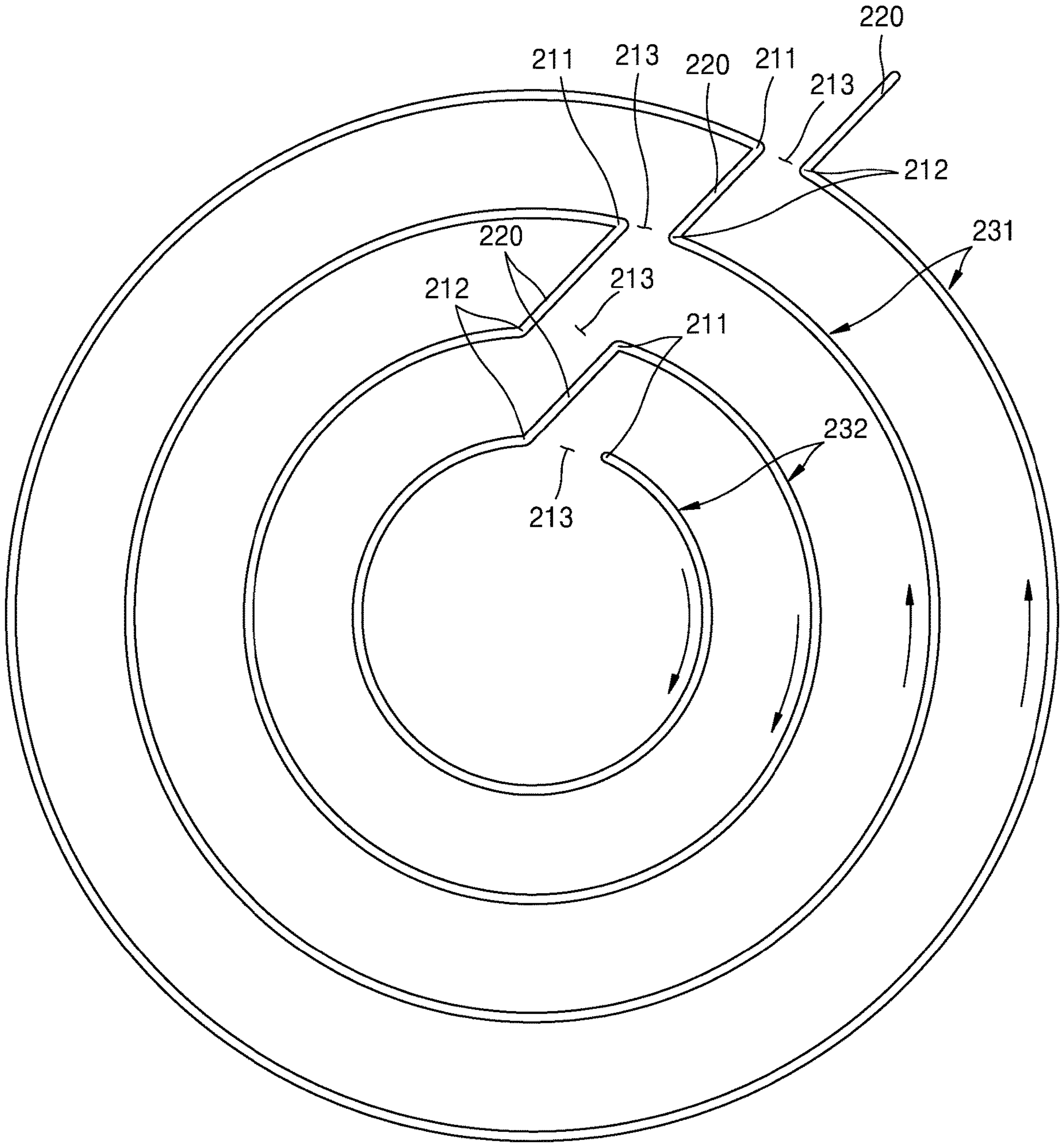
FIG. 8 is a diagram showing that a plurality of first internal unit coils are stacked and then a second internal unit coil having a different extension direction from the first internal unit coil extend, according to an embodiment of the present disclosure.

Referring to FIG. 8, after the plurality of first internal unit coils 231 extends, the second internal unit coil 232 may extend or after the plurality of second internal unit coils 232 extend, the first internal unit coil 231 may extend.

In more detail, the first internal unit coil 231 and the second internal unit coil 232 may not extend alternately one by one, and the plurality of first internal unit coils 231 and the plurality of second internal unit coils 232 may be stacked in a random order.

According to an embodiment of the present disclosure, a plurality of internal unit coils having different winding directions (the first internal unit coil 231 and the second internal unit coil 232) may be used, and accordingly, plasma density may be finely adjusted.

The plasma source using the planar helical coil according to an embodiment of the present disclosure described above may have the following effects.

In the plasma source using the planar helical coil according to an embodiment of the present disclosure, a plurality of unit coils having a larger diameter than a diameter or width of a wafer may be stacked and connected to each other through a connector extending in a perpendicular direction to a plan defined by the unit coil.

In the plasma source using the planar helical coil according to an embodiment of the present disclosure, a plasma density at an edge of a wafer may be advantageously increased by forming plasma inside a chamber while stacking a plurality of unit coils each having a larger diameter or width than the wafer and extending inside one plane.

In the plasma source using the planar helical coil according to an embodiment of the present disclosure, plasma density inside a chamber may be advantageously finely adjusted by making current directions in a plurality of unit coils be the same or mixing and arranging a first unit coil and a second unit coil in which currents flow in different directions.

In the plasma source using the planar helical coil according to an embodiment of the present disclosure, a plasma density at a central portion of a wafer may be advantageously finely adjusted as plasma is formed within a chamber by providing a plurality of internal unit coils having a smaller diameter than a diameter or width of a wafer on the same plane and connecting the plurality of internal unit coils through a connector.

The plasma source using the planar helical coil according to an embodiment of the present disclosure may be used for ICP, but is not limited thereto, and may be used for various types of plasma.

As such, the present disclosure has been described with reference to the embodiments shown in the drawings, but this is only exemplary, and those skilled in the art will understand that various modifications and equivalent other embodiments are possible therefrom. Therefore, the true technical scope of the disclosure should be determined by the technical spirit of the appended claims.

The invention claimed is:

1. A plasma source using a planar helical coil, provided above a chamber and forming plasma, the plasma source comprising:
- a unit coil extending from one unit-extension end, and extending, within one plane, in a circular shape to another unit-extension end,
- the unit coil being stacked a plurality of times; and
- a connector connecting the other unit-extension end of one unit coil to the unit-extension end of another unit coil,
- an internal coil having a smaller diameter than a diameter or width of a wafer accommodated on a base plate inside the chamber,
- wherein the connector has a length of about 5 mm to about 15 mm, wherein a separation distance is provided between the unit-extension end and the other unit-extension end of the unit coil, wherein the internal coil includes a plurality of internal unit coils having a circular shape, and the plurality of internal unit coils are provided on a same plane, wherein the internal unit coil extends in a circular shape from an internal unit-extension end to another internal unit-extension end, and the plasma source further includes an internal connector configured to connect the other internal unit-extension end of one internal unit coil to the internal unit-extension end of another internal unit coil, wherein an internal separation distance is provided between the internal unit-extension end and the other internal unit-extension end of the internal unit coil.

2. The plasma source of claim 1, wherein the connector extends perpendicular to a plane defined by the unit coil, and planes defined by the plurality of unit coils extend in parallel to each other.

3. The plasma source of claim 1, wherein a diameter of the unit coil is larger than a diameter or width of a wafer accommodated on a base plate inside the chamber, and planes defined by the plurality of unit coils are in parallel to a plane on which the wafer is accommodated.

4. The plasma source of claim 1, wherein the plurality of unit coils are directed in a same direction toward the other unit-extension end from the unit-extension end.

5. The plasma source of claim 1, wherein the plurality of unit coils include:

a first unit coil extending counterclockwise to the other unit-extension end from the unit-extension end; and a second unit coil extending clockwise to the other unit-extension end from the unit-extension end.

6. The plasma source of claim 5, wherein the first unit coil and the second unit coil are alternately stacked.

7. The plasma source of claim 5, wherein, after the first unit coil is stacked a plurality of times, the second unit coil is stacked, or after the second unit coil is stacked a plurality of times, the first unit coil is stacked.

8. The plasma source of claim 1, wherein a plurality of the internal connector connecting the internal unit coils extend in parallel to each other.

9. The plasma source of claim 1, wherein a plurality of the internal unit coil include:

a first internal unit coil extending counterclockwise to the other internal unit-extension end from the internal unit-extension end; and a second internal unit coil extending clockwise to the other internal unit-extension end from the internal unit-extension end.

* * * * *